United States Patent
McDonald

(10) Patent No.: US 7,108,185 B2
(45) Date of Patent: Sep. 19, 2006

(54) APPARATUS AND METHOD FOR MANAGEMENT OF CALIBRATION DATA

(75) Inventor: Mark E. McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/402,606

(22) Filed: Mar. 28, 2003

(65) Prior Publication Data

US 2004/0188518 A1  Sep. 30, 2004

(51) Int. Cl.
*G06K 7/10* (2006.01)

(52) U.S. Cl. ............................ 235/462.01; 235/492

(58) Field of Classification Search ........................
235/462.01–462.47, 380, 382, 454, 375,
235/383, 38, 492; 372/38.02, 29.02, 38.2;
398/201, 183, 197
See application file for complete search history.

(56) References Cited

U.S. PATENT DOCUMENTS

| | | | | |
|---|---|---|---|---|
| 4,654,127 A | * | 3/1987 | Baker et al. ................. 205/792 |
| 5,204,053 A | * | 4/1993 | Fennern ...................... 376/267 |
| 5,311,426 A | * | 5/1994 | Donohue et al. ............ 422/102 |
| 5,554,273 A | * | 9/1996 | Demmin et al. ............. 205/785 |
| 5,606,516 A | * | 2/1997 | Douglas et al. ............. 702/104 |
| 5,780,843 A | * | 7/1998 | Cliche et al. ................ 250/226 |
| 5,869,819 A | * | 2/1999 | Knowles et al. ............. 235/375 |
| 6,323,987 B1 | * | 11/2001 | Rinaudo et al. ............ 359/260 |
| 6,588,670 B1 | * | 7/2003 | Bukowski ................ 235/462.45 |
| 6,697,397 B1 | * | 2/2004 | Theodoras ................ 372/29.02 |
| 6,741,629 B1 | * | 5/2004 | Garnache et al. .............. 372/96 |
| 2003/0091074 A1 | * | 5/2003 | Theodoras ................ 372/29.02 |
| 2005/0043857 A1 | * | 2/2005 | Van Fleet ..................... 700/286 |
| 2005/0100065 A1 | * | 5/2005 | Coldren et al. ........... 372/38.02 |

\* cited by examiner

*Primary Examiner*—Thien M. Le
(74) *Attorney, Agent, or Firm*—Blakely, Sokoloff, Taylor & Zafman LLP

(57) ABSTRACT

An apparatus comprising a device having calibration data associated therewith, and a calibration tag placed on the device, the calibration tag having encoded thereon the calibration data or a locator identifying where the calibration data can be found. A process comprising calibrating a device to obtain a set of calibration data, generating a calibration tag, the calibration tag having encoded thereon the calibration data or a locator identifying where the calibration data can be found, and placing the calibration tag on the device. Other embodiments are also described and claimed.

51 Claims, 4 Drawing Sheets

APPARATUS AND METHOD FOR MANAGEMENT OF CALIBRATION DATA

TECHNICAL FIELD

The present invention relates generally to device calibration and in particular, but not exclusively, to an apparatus and method for managing device calibration data.

BACKGROUND

Many devices such as electronic instruments, lasers, etc, require a calibration before they can operate properly. Calibration involves correlating the device's input to its output; in other words, for each desired output calibration establishes the input values that produce that output. At its simplest, for example in a device having a single input, calibrating the device is a relatively simple matter of correlating output to input. In more complex devices having multiple inputs, however, there may be multiple combinations of inputs that produce the same output; in these cases, some form of optimization can be performed to determine which combination of inputs best produces the desired output based on some figure of merit. For instance, one may want the combination of inputs that produces the desired output using the minimum amount of power. Using a tunable laser as an example, proper tuning of the laser requires that various components within the laser be maintained at specified temperature. In most devices the temperature is not controlled directly. Instead, the temperature is the result of applying some other characteristic, such as an electrical current, to the component. A calibration must be performed to determine what electrical current and/or voltage will correspond to a given temperature, and what wavelength results from a given temperature.

In most cases—especially those where there is some optimization in the calibration—the calibration can be expensive and time consuming, and may require very specialized and expensive equipment. The result of a calibration is usually a set of calibration data, also known as a "calibration table" or a "calibration matrix." The calibration table or matrix usually tabulates or otherwise sets forth the desired outputs along with the inputs that produce those outputs. The data can be presented in the table or matrix in raw form or in some alternative presentation, such as a polynomial, spline, or other representation of the output as a function of the input variables. For simple devices the calibration data can comprise only a small amount of data, but for more complex devices such as a tunable laser the set of calibration data will be substantially larger.

Some devices require a unique set of calibration data for each unit. For example, the performance of some devices, such as tunable lasers, is extremely sensitive to manufacturing tolerances; in such cases, no single calibration will work properly for every single unit of the device, because every unit will be different due to differences caused by the buildup of manufacturing tolerances. For such devices, an individual and unique calibration must be performed for every single unit produced.

In many, if not most, devices, the calibration data is stored not in the device itself, but rather is stored electronically in a controller. In some devices, the controller is part of the device itself, but in others-particularly in miniaturized devices that have no space for an internal controller-the controller is a separate unit. When the calibration data is stored in a controller separate from the device the calibration data becomes associated with the controller, rather than with the device. This presents a pair of problems: first, in some cases the device may be sold without an attached controller, so that the customer may choose a controller that best meets their particular use of the device. Second, whether or not the controller is sold with the device, if the controller is ever damaged or replaced, the calibration data specific to the device to which the controller was coupled will disappear. For example, if the controller is damaged by a power surge, the user could simply swap in a new controller. The new controller, however, would not have the calibration data stored on it and, because the original controller was damaged, the calibration data could not be recovered from it. Thus, the user would have to re-calibrate the device each time a new controller is installed. A user may not want to invest the substantial amount of time necessary for calibration, and may also not want to invest in the expensive and sometimes extensive instrumentation needed. In this case, the user's only recourse would be to return the device to the manufacturer for recalibration, which would result in significant downtime for the user as well as significant expense for both the user and the manufacturer.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus and method for managing calibration data are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
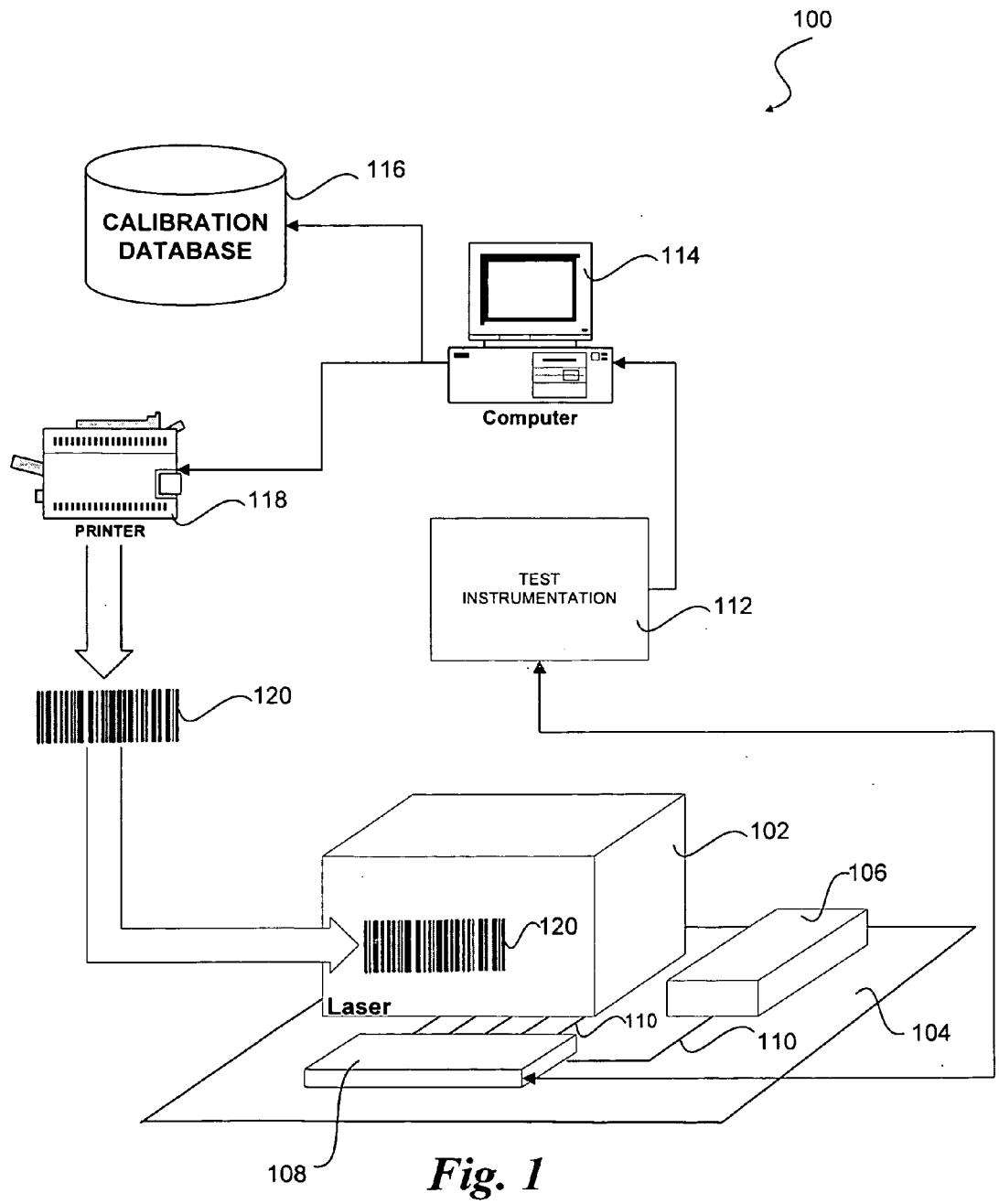
FIG. 1 is a block diagram illustrating an embodiment of an apparatus for obtaining and storing calibration data, and placing the calibration data on a device.

FIG. 1 illustrates an embodiment 100 of an apparatus for calibrating a device to obtain a set of calibration data specific to the device and, once obtained, to associate the calibration data directly with the device or, alternatively, to store the calibration data and associate the location of the stored calibration data with the device. The apparatus 100 includes a set of test instrumentation 112 coupled to components associated with the device 102 being calibrated. The test instrumentation is also connected to, and interfaces with, a computer 114. The computer 114 is in turn coupled to a calibration database where the calibration data for the device 102 can be stored, as well as to a printer 118 capable of printing out optically readable symbols, such as the linear bar code 120, that can encode the calibration data and can be placed on the device.

In the context of the apparatus 100, the device to be calibrated is a tunable laser 102, although in other embodiments the device can be any device requiring calibration. The tunable laser 102 is mounted on, and electrically coupled to, a circuit board 104. Also mounted on the circuit board 104 are a memory 106 and a device controller 108. The memory 106 is coupled to the controller 108 via printed circuit lines 110. The controller 108 is similarly connected to the tunable laser 102 via printed circuit lines.

The test instrumentation 112 is coupled to the tunable laser 102 via the controller 108. The test instrumentation includes instruments that measure both the inputs to the device and the outputs from the device. In the tunable laser 102, for example, proper tuning requires that various components within the laser, such as the laser cavity and/or filters through which the laser light is passed, be maintained at specified temperatures. The temperature is not controlled directly, but instead is the result of applying some other quantity, such as a certain electrical current, to the particular component. The tunable laser 102 must be calibrated to determine what electrical current and/or voltage produces a given temperature, and what wavelength results from a given temperature. Thus, for a tunable laser 102 the test instrumentation may include one or more voltage and/or electrical current meters to measure the input values applied to the components inside the laser. To measure the appropriate characteristic of the laser's output—in this case, its frequency or wavelength—the test instrumentation can include wavelength or frequency measuring instrument such as an optical spectrum analyzer.

The computer 114 is coupled to the test instrumentation 112. The computer 114 uses the test instruments 112 to provides input to the controller 108, and also collects data from the test instrumentation 112 regarding the output (e.g., wavelength or frequency for the tunable laser 102) corresponding to the inputs. In the embodiment shown, the computer 114 is a standalone computer such as a personal computer (PC), but in other embodiments the computer 114 could, for instance, be a mainframe, workstation, or embedded system. Additionally, although the computer 114 is show separately from the test instrumentation 112, in another embodiment both could be integrated into a single unit.

The calibration database 116 acts a repository for calibration data obtained from the calibration of different units of the device 102. The calibration database 116 may be resident on the computer 114, but is preferably separate from the computer and coupled to the computer by a network, such as a local-area network (LAN), a wide-area network (WAN) or the Internet. As its name implies, the calibration database 116 stores, indexes, and otherwise manages the calibration data obtained from each different production units of the device 102. In one embodiment, the calibration database could store calibration data indexed by the serial number of the device, but other forms of indexing and storage are possible in other embodiments. The calibration database 116 can operate using any kind of database software, including commercially available database packages such as MICROSOFT ACCESS, ORACLE, etc, or custom database packages specifically created for the task.

Also coupled to the computer 114 is a printer 118. The printer 118 is used to print a calibration tag 120 to be placed on the device 102. In the embodiment shown, the calibration tag is a label with an optically readable code printed thereon that can encode the calibration data for the particular device 102 or, alternatively, can encode a locator indicating where the calibration data is stored and can be found. In other embodiments, optically readable symbols can be placed on the device 102 in other ways besides printing them on a label and sticking the label to the device. For example, the computer 114 could be coupled to an apparatus that can etch the optically readable symbol directly on the device 102. This could be desirable in cases where the device will face operating environments that may cause a simple label to fall off. Since the goal is to ensure that the calibration data remains associated with the particular unit of device 102 with which it belongs, this can be advantageous.

In operation, the apparatus 100 is first used to calibrate the device 102. The computer 114, operating in conjunction with the test instrumentation 112, instructs the controller 108 to set certain parameters within the device. In the example of tunable laser 102, a laser cavity and one or more filters found within the laser must be maintained at certain temperatures. The computer 114 and test instrumentation 112 may set the currents and/or voltages delivered to the cavity and the filters to maintain them at the required temperature. As the values of the inputs are set, the test instrumentation measures the relevant output of the device; in this example the relevant output is the frequency and/or wavelength of the laser light exiting the laser. In some cases, the computer may include optimizing routines thereon for optimizing the inputs to produce a certain output. For instance, more than one combination of laser and filter temperatures may result in the desired output wavelength, but the combination of inputs with the lowest power may be the most desirable.

When the computer 114 and test instrumentation 112 have completed the calibration, the resulting calibration data is encoded into a calibration tag 120, such as a label having printed thereon an optically readable symbol such as linear bar code. In addition to being encoded in a tag, the calibration data can be stored by the computer 114 in the calibration database 116, along with an identification or index (e.g., a serial number) of the particular unit with which the calibration data is associated. In embodiments where the calibration data is indexed and stored, instead of having the calibration data directly encoded in the calibration tag 120, the information encoded on the tag can be only the information needed to find and retrieve the calibration data, such as indexing information and a locator indicating where the data is stored and can be found. The locator can, for example, be an Internet Protocol (IP) address, a Media Access Control (MAC) address, or other type of network address of a network-accessible database.

Figure 2A:
FIGS. 2A–2C are drawings illustrating various possible embodiments of a calibration tag.
Figure 2B:
Figure 2C:
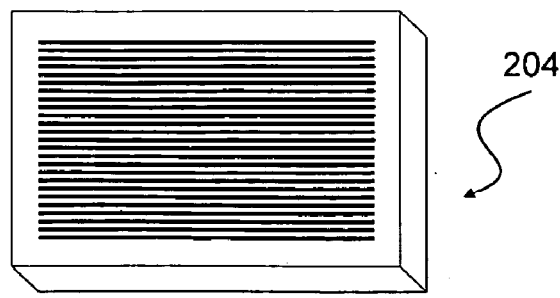

FIGS. 2A–2C illustrate various possible embodiments of the calibration tag 120. In the embodiment shown in FIG. 1, the calibration tag 120 is shown as a linear bar code, but it can be any of the optically readable codes shown in FIGS. 2A and 2B, or may be some other type of tag, such as the radio frequency tag shown in Figure. For instance, in cases where the calibration data is directly encoded in the optically readable symbol, a linear bar code such as bar code 200 may not have enough information capacity for large sets of calibration data. In these cases, a different optically readable symbol such as matrix code 202 (also known as a 2-D bar code), which has a substantially larger information density, can be used. For cases where the label encodes only an address where the calibration data can be found, a simple linear bar code will likely have enough information density, although alternatives such as a matrix code can be used as well. In some instances, calibration tags that do not rely on optical reading can be used. One alternative calibration tag, for instance, would be a radio frequency (RF) tag 204 on which the calibration data for the particular device 102 can be encoded or, alternatively, on which a locator indicating where the calibration data is stored and can be found is encoded. Other types of calibration tags besides those described herein, whether optically readable or otherwise, can also be used.

Figure 3:
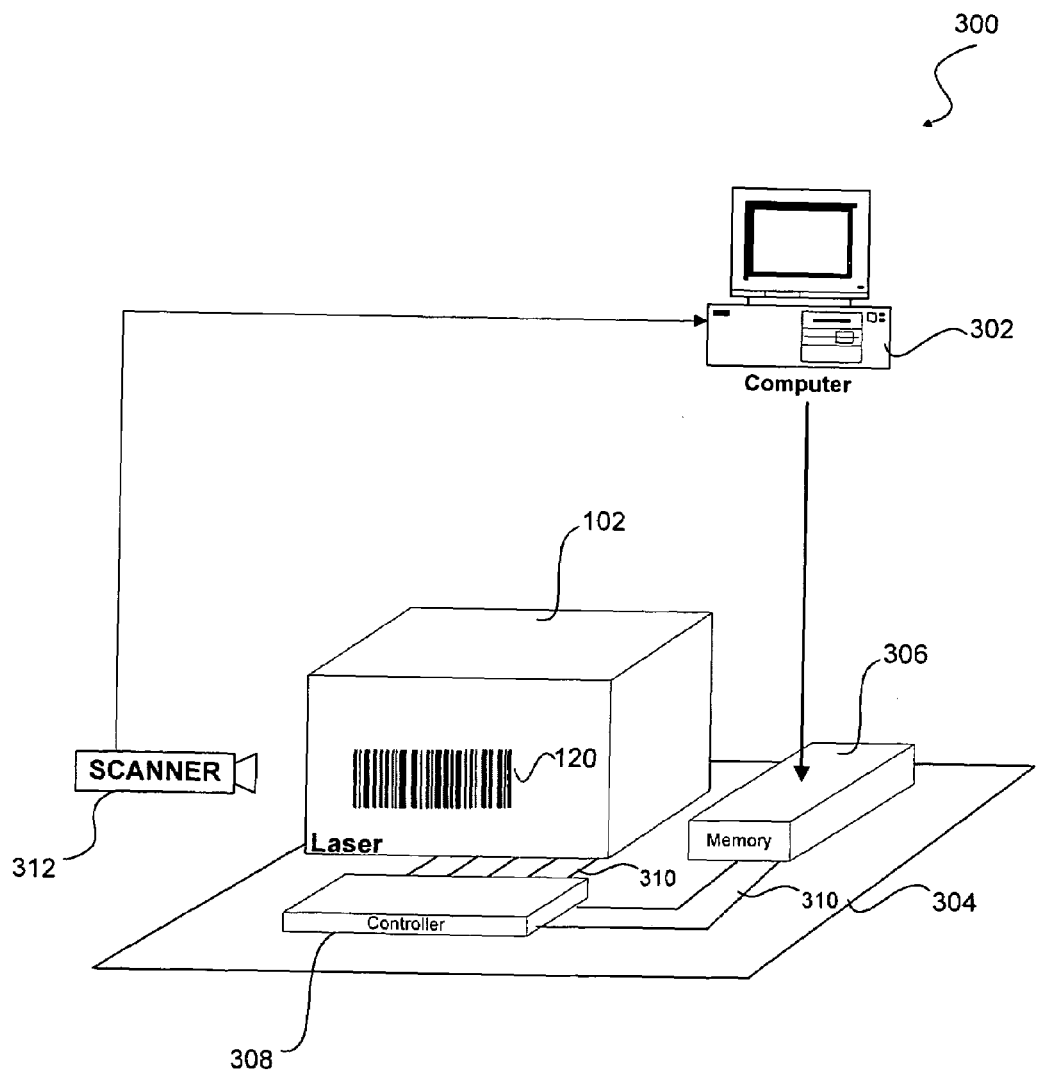
FIG. 3 is a block diagram illustrating an embodiment of an apparatus for retrieving and using calibration data.
Figure 4:
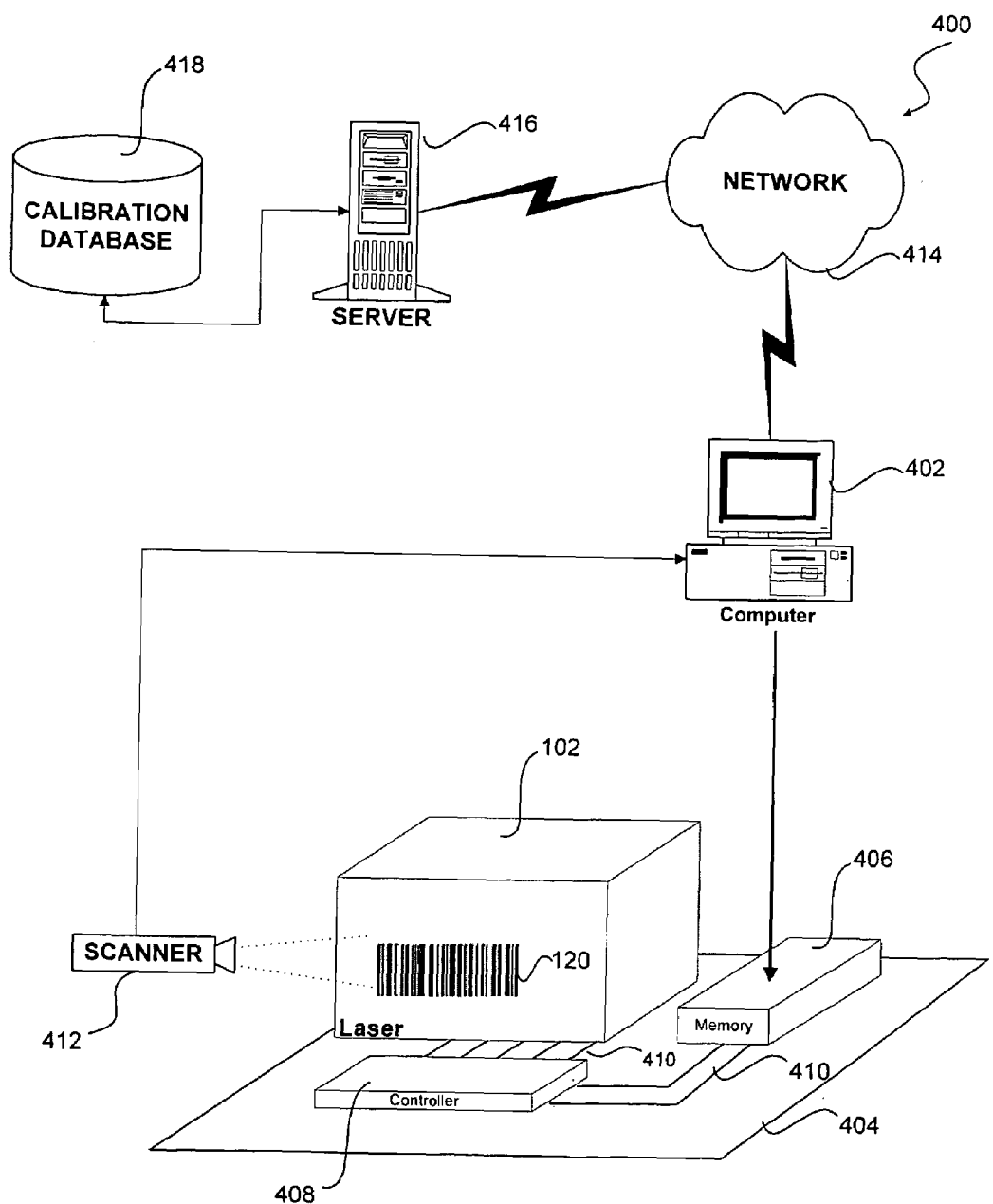
FIG. 4 is a block diagram illustrating an alternative embodiment of an apparatus of retrieving and using calibration data.

FIG. 3 illustrates an embodiment 300 of an apparatus for retrieving calibration data directly encoded in an optically readable code placed on the device. In the apparatus 300, the device is a previously calibrated tunable laser 102, although in other embodiments the device subject to calibration may be a different device. The tunable laser 102 is mounted on, and electrically coupled to, a circuit board 304, which can be the same or different than the printed circuit board 104 on which the device 102 was calibrated. Also mounted to the circuit board 304 are a memory 306 and a device controller 308. The memory 306 is coupled to the controller 308 via printed circuit lines 310; similarly, the controller 308 is connected to the tunable laser 302 via printed circuit lines. A computer 302 is coupled to a scanner 312, as well as being coupled, at least temporarily, to the memory 306 on the printed circuit board 304.

The computer 302 will generally be a different computer than the computer 114 used to calibrate the device 102. In the embodiment shown, the computer 302 is a standalone computer such as a personal computer (PC), but in other embodiments not shown the computer 302 could, for example, be a mainframe, workstation, or embedded system.

The scanner 312 can be any scanner capable of reading the calibration tag placed on the device 102, whether the calibration tag is an optically readable code, a radio frequency tag, or some other form of tag. In the embodiment shown, the tag placed on the device 102 is a linear bar code that is either printed on a label and placed on the device or is etched directly on the device. Thus, in the apparatus 300 the scanner is a bar code scanner capable of reading a linear bar code. In other embodiments where the calibration tag is of a different type, a different type of scanner can be used. For example, where the calibration tag is a matrix code, a machine vision system can be used to read it. Similarly, where the calibration tag is a radio frequency (RF) tag, an appropriate reader can be used to extract the information therefrom.

In operation of the apparatus 300, the scanner 312 reads the calibration data encoded in the linear bar code 120 in a manner well known in the art. The information read from the bar code 120 is transmitted to the computer, which includes software to decode the information received from the scanner 312. Once the calibration data is decoded from the linear bar code 120 by the software, the calibration data is transferred from the computer 302 to the memory 306. Once in the memory 306, the calibration data is available to the controller 308 for use in the proper operation of the device 102.

FIG. 3 illustrates an embodiment 400 of an apparatus for retrieving calibration data from a location where it is stored. In the apparatus 400, the device is a previously calibrated tunable laser 102, although in other embodiments the device may be different. The tunable laser 102 has placed thereon a calibration tag 120, in this case an optically readable symbol such as a linear bar code. In the embodiment 400, the calibration data corresponding to the device 102 is not directly encoded in the bar code of the calibration tag 120. Instead, the bar code has encoded thereon the identity of the particular device 102 (e.g., its serial number) as well as a locator that specifies a location where the calibration data corresponding to the device 102 is stored and can be found. In the embodiment 400, the locator can be a network address pointing to a location on the network, such as the calibration database 418, where the calibration data is stored. Examples of possible network addresses include Internet Protocol (IP) addresses, Media Access Control (MAC) addresses, and the like.

In the embodiment 400, the device 102 is mounted to, and electrically coupled with, a circuit board 404. Also mounted to the circuit board 404 are a memory 406 and a device controller 408. The memory 406 is coupled to the controller 408 via printed circuit lines 410; similarly, the controller 408 is connected to the tunable laser 102 via printed circuit lines. A computer 402 is coupled to a scanner 412, as well as to the memory 406 on the printed circuit board 404.

In addition to being coupled to the scanner 412 and the memory 406, the computer 402 is connected to a network 414, which can be any kind of electronic network. Examples of suitable networks include local-area networks (LAN), a wide-area networks (WAN) or the Internet. Also connected to the network 414 is a server 416. The server 416 is in turn connected to a calibration database 418, which may be separate from the server 416, or may be resident on the server.

In operation of the apparatus 400, the scanner 412 reads the information encoded in the calibration tag 120. The information read from the calibration tag 120 is transmitted to the computer 402, which has software thereon to decode the information received from the scanner. As discussed above, in one embodiment the information on the calibration tag 120 comprises and identification of the particular device, such as a serial number, and a locator identifying where the calibration data corresponding to that device is stored. Using this information, the computer accesses the network 414 and finds and accesses the server 416 and the calibration database 418. The serial number of the device is used to retrieve the proper calibration data from the database. Upon retrieval from the database 418, the calibration data is transmitted via the network 414 to the computer 402. When the computer 402 has received the calibration data, it is transmitted to the memory 406. Once in the memory 406, the calibration data is available to the controller 408 for use in operating the device 102.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
   a tunable laser having calibration data associated therewith, the calibration data comprising a calibration table that associates an output wavelength with one or more inputs; and
   a calibration tag placed on the tunable laser, the calibration tag having encoded thereon the calibration data or a locator identifying where the calibration data can be found.

2. The apparatus of claim 1 wherein the calibration tag comprises an optically readable symbol.

3. The apparatus of claim 2 wherein the optically readable symbol is a linear bar code or a matrix code.

4. The apparatus of claim 2 wherein the optically readable symbol is printed on a label.

5. The apparatus of claim 2 wherein the optically readable symbol is etched on the tunable laser.

6. The apparatus of claim 1 wherein the calibration tag comprises a radio frequency (RF) tag.

7. The apparatus of claim 1 wherein the locator is a network address identifying a network-accessible database where the calibration data is stored and can be retrieved.

8. The apparatus of claim 7 wherein the network address is an internet protocol (IP) address.

9. The apparatus of claim 1, further comprising a device controller including a memory, wherein the calibration data is retrieved via the calibration tag and stored in the memory.

10. The apparatus of claim 9 wherein the memory is integral in the device controller.

11. An article of manufacture comprising:
    a calibration tag having encoded thereon calibration data or a locator identifying where the calibration data can be found, the calibration data comprising a calibration table that associates an output wavelength with one or more inputs; and
    means for placing the calibration tag on a tunable laser with which the calibration data is associated.

12. The article of manufacture of claim 11 wherein the calibration tag comprises an optically readable symbol.

13. The article of manufacture of claim 12 wherein the optically readable symbol is a linear bar code or a matrix code.

14. The article of manufacture of claim 12 wherein the optically readable symbol is printed on a label.

15. The article of manufacture of claim 11 wherein the means for placing the calibration tag on the tunable laser comprises a label on which the calibration tag is printed.

16. The article of manufacture of claim 11 wherein the means for placing the calibration tag on the tunable laser comprises etching the calibration tag on the tunable laser.

17. The article of manufacture of claim 11 wherein the calibration tag is a radio frequency (RF) tag.

18. A system comprising:
    a tunable laser having calibration data associated therewith, the calibration data comprising a calibration table that associates an output wavelength with one or more inputs;
    a calibration tag placed on the tunable laser, the calibration tag having encoded thereon the calibration data or a locator identifying where the calibration data can be found;
    a reader to retrieve the information from the calibration tag;
    a processor coupled to the reader to process the information retrieved from the calibration tag; and
    a device controller coupled to the tunable laser and including a memory, wherein the calibration data is downloaded to the memory by the processor.

19. The system of claim 18 wherein the calibration tag comprises an optically readable symbol.

20. The system of claim 19 wherein the optically readable symbol is a linear bar code or a matrix code.

21. The system of claim 19 wherein the optically readable symbol is printed on a label.

22. The system of claim 19 wherein the calibration tag is etched on the tunable laser.

23. The system of claim 18 wherein the calibration tag comprises a radio frequency (RF) tag.

24. The system of claim 18 wherein the processor decodes the calibration data encoded in the calibration tag.

25. The system of claim 18 wherein the processor decodes the locator encoded in the calibration tag to identify where the calibration data can be found.

26. The system of claim 18 wherein the locator is a network address identifying a network-accessible database where the calibration data is stored.

27. The system of claim 26 wherein the network address is an Internet Protocol (IP) address or a Media Access Control (MAC) address.

28. The system of claim 26 wherein the processor is coupled to the network and retrieves the calibration data stored in the network-accessible database.

29. A process comprising:
    calibrating a tunable laser to obtain a set of calibration data comprising a calibration table that associates an output wavelength with one or more inputs;
    generating a calibration tag, the calibration tag having encoded thereon the calibration data or a locator identifying where the calibration data can be found;
    placing the calibration tag on the tunable laser.

30. The process of claim 29 wherein the calibration tag comprises an optically readable symbol.

31. The process of claim 30 wherein the optically readable symbol is a linear bar code or a matrix code.

32. The process of claim 29 wherein placing the calibration tag on the tunable laser comprises printing the calibration tag on a label and placing the label on the tunable laser.

33. The process of claim 29 wherein placing the calibration tag on the tunable laser comprises etching the calibration tag on the tunable laser.

34. The process of claim 29 wherein the calibration tag comprises a radio frequency (RF) tag.

35. The process of claim 29, further comprising storing the calibration data in a database.

36. The process of claim 35 wherein the database is accessible via a network.

37. The process of claim 29 wherein the locator is a network address identifying a network-accessible database where the calibration data is stored.

38. The process of claim 37 wherein the network address is an internet protocol (IP) address.

39. A process comprising:
    reading information from a calibration tag attached to a tunable laser, the tunable laser having calibration data associated therewith and a controller with a memory coupled thereto, and the calibration tag having the calibration data encoded thereon, wherein the calibration data comprises a calibration table that associates an output wavelength with one or more inputs;
    decoding the information read from the calibration tag to extract the calibration data; and
    writing the calibration data to the memory.

40. The process of claim 39 wherein the calibration tag comprises an optically readable symbol.

41. The process of claim 40 wherein the optically readable symbol is a linear bar code or a matrix code.

42. The process of claim 39 wherein the calibration tag comprises a radio frequency (RF) tag.

43. A process comprising:
  reading information from a calibration tag attached to a tunable laser, the tunable laser having calibration data associated therewith and a controller with a memory coupled thereto, and the calibration tag having encoded thereon a locator identifying where the calibration data can be found, wherein the calibration data comprises a calibration table that associates an output wavelength with one or more inputs;
  using the information read from the calibration tag, finding a location where the calibration data is stored; and
  retrieving the calibration data from the location.

44. The process of claim 43, further comprising writing the calibration data to the memory.

45. The process of claim 43 wherein the calibration tag comprises an optically readable symbol.

46. The process of claim 45 wherein the optically readable symbol is a linear bar code or a matrix code.

47. The process of claim 43 wherein the calibration tag comprises a radio frequency (RF) tag.

48. The process of claim 43 wherein using the information read from the calibration tag comprises extracting the locator encoded in the calibration tag to identify the location where the calibration data can be found.

49. The process of claim 43 wherein the locator is a network address identifying a network-accessible location where the calibration data is stored.

50. The process of claim 49 wherein the location where the calibration data is stored is a network-accessible database.

51. The process of claim 50 wherein retrieving the calibration data comprises:
  accessing the network-accessible database where the calibration data is stored, and
  downloading the calibration data from the network-accessible database via a network.

* * * * *